US006934929B2

(12) United States Patent
Brist et al.

(10) Patent No.: US 6,934,929 B2

(45) Date of Patent: Aug. 23, 2005

(54) METHOD FOR IMPROVING OPC MODELING

(75) Inventors: Travis Brist, Camas, WA (US); George Bailey, Welches, OR (US)

(73) Assignee: LSI Logic Corporation, Milpitas, CA (US)

( * ) Notice: Subject to any disclaimer, the term of this patent is extended or adjusted under 35 U.S.C. 154(b) by 206 days.

(21) Appl. No.: 10/341,119

(22) Filed: Jan. 13, 2003

(65) Prior Publication Data

US 2004/0139420 A1 Jul. 15, 2004

(51) Int. Cl.[7] ......................... G06F 17/50; G06F 19/00; G06K 9/03; G06K 9/20; G06K 9/46

(52) U.S. Cl. ........................... 716/21; 378/35; 382/144; 382/154; 382/165; 382/190; 382/170; 250/311; 702/40; 702/172

(58) Field of Search ............................ 716/21; 378/35; 382/144, 154, 16, 170, 190, 165; 250/311; 702/40, 72, 172; 700/110, 121

(56) References Cited

U.S. PATENT DOCUMENTS 4,866,782 A * 9/1989 Sugie et al. ................ 382/145
5,646,870 A * 7/1997 Krivokapic et al. ........... 716/4
5,655,110 A * 8/1997 Krivokapic et al. .......... 716/19
5,887,080 A * 3/1999 Tsubusaki et al. .......... 382/172
6,081,659 A * 6/2000 Garza et al. .................. 716/21
6,111,981 A * 8/2000 Tsubusaki et al. .......... 382/172
6,130,750 A * 10/2000 Ausschnitt et al. ......... 356/401
6,185,323 B1 * 2/2001 Archie et al. ............... 382/145
6,194,720 B1 * 2/2001 Li et al. ..................... 250/311
6,317,211 B1 * 11/2001 Ausschnitt et al. ......... 356/401
6,334,209 B1 * 12/2001 Hashimoto et al. ........... 716/21
6,392,229 B1 * 5/2002 Dana et al. ................. 250/306
6,421,457 B1 * 7/2002 Su ............................. 382/149
6,462,343 B1 * 10/2002 Choo .................... 250/370.08
6,539,106 B1 * 3/2003 Gallarda et al. ............ 382/149

(Continued)

FOREIGN PATENT DOCUMENTS

JP 2000012426 A * 1/2000 ......... H01L/21/027

OTHER PUBLICATIONS

NB9011466, "Laser–Ablated Resist Via Inspection", IBM Technical Disclosure Bulletin, vol. 33, No. 6B, Nov. 1990, pp. 466–470 (5 pages).*

Bernard, "Simulation of focus effects in photolithography", IEEE Transactions on Semiconductor Manufacturing, vol. 1, No. 3, Aug. 1988, pp. 85–87.*

Jinbo et al., "0.2 um or less i–line lithography by phase–shifting–mask technology", International Electron Devices Meeting, Dec. 9, 1990, pp. 825–828.*

Kotera et al., "Characteristic variation of exposure pattern in the cell–projection electron beam lithography", 1999 International Microprocesses and Nanotechnology Conference, Jul. 6, 1999, pp. 34–35.*

Mentor Graphics Corporation; Calibre WORKbench User's Manual; 2002; Part 3 (Chapters 12–16).

KLA–Tencor Corporation; Prolith User's Manual; 2000–2001; Chapter 3, pp. 30 and 31.

Stephen H. Thornton, "Lithography Model Tuning: Matching Simulation to Experiment"; SPIE vol. 2726, pp. 223–235; Feb. 1996.

*Primary Examiner*—Matthew Smith
*Assistant Examiner*—Phallaka Kik
(74) *Attorney, Agent, or Firm*—Trexler, Bushnell, Giangiorgi & Blackstone, Ltd.

(57) ABSTRACT

The invention provides a method for OPC modeling. The procedure for tuning a model involves collecting cross-section images and critical dimension measurements through a matrix of focus and exposure settings. These images would then run through a pattern recognition system to capture top critical dimensions, bottom critical dimensions, resist loss, profile and the diffusion effects through focus and exposure.

15 Claims, 3 Drawing Sheets

U.S. PATENT DOCUMENTS

| | | | | | |
|---|---|---|---|---|---|
| 6,546,125 | B1 | * | 4/2003 | Su | 382/144 |
| 6,573,499 | B1 | * | 6/2003 | Sasajima et al. | 250/310 |
| 6,608,920 | B1 | * | 8/2003 | Su et al. | 382/144 |
| 6,625,497 | B2 | * | 9/2003 | Fairbairn et al. | 700/1 |
| 6,642,519 | B2 | * | 11/2003 | Ikeda | 250/307 |
| 6,765,204 | B2 | * | 7/2004 | Sasajima et al. | 250/310 |
| 6,771,806 | B1 | * | 8/2004 | Satya et al. | 382/149 |
| 6,813,756 | B2 | * | 11/2004 | Igarashi et al. | 716/14 |
| 6,832,364 | B2 | * | 12/2004 | Heng et al. | 716/21 |
| 6,856,931 | B2 | * | 2/2005 | Yoshida | 702/127 |
| 6,873,720 | B2 | * | 3/2005 | Cai et al. | 382/149 |
| 2001/0028740 | A1 | * | 10/2001 | Suzuki | 382/195 |
| 2002/0074496 | A1 | * | 6/2002 | Sadayama | 250/311 |
| 2002/0097913 | A1 | * | 7/2002 | Ikeda | 382/199 |
| 2002/0151092 | A1 | * | 10/2002 | Li et al. | 438/16 |
| 2002/0155629 | A1 | * | 10/2002 | Fairbairn et al. | 438/14 |
| 2002/0158197 | A1 | * | 10/2002 | Dana et al. | 250/306 |
| 2002/0164064 | A1 | * | 11/2002 | Karklin et al. | 382/145 |
| 2002/0164065 | A1 | * | 11/2002 | Cai et al. | 382/149 |
| 2003/0015660 | A1 | * | 1/2003 | Shishido et al. | 250/311 |
| 2003/0021463 | A1 | * | 1/2003 | Yamaguchi et al. | 382/145 |
| 2003/0026471 | A1 | * | 2/2003 | Adel et al. | 382/144 |
| 2003/0067496 | A1 | * | 4/2003 | Tasker et al. | 345/846 |
| 2003/0071213 | A1 | * | 4/2003 | Ikeda | 250/307 |
| 2003/0106642 | A1 | * | 6/2003 | Fairbairn et al. | 156/345.24 |
| 2004/0209175 | A1 | * | 10/2004 | Moriya et al. | 430/5 |
| 2004/0217288 | A1 | * | 11/2004 | Sasjima et al. | 250/310 |

* cited by examiner

METHOD FOR IMPROVING OPC MODELING

BACKGROUND OF THE INVENTION

The present invention relates to a method of improving OPC modeling.

During the optical lithography step in integrated circuit fabrication, a device structure is patterned by imaging a mask onto a radiation sensitive film (photoresist or resist) coating different thin film materials on the wafer. These photoresist films capture the pattern delineated through initial exposure to radiation and allow subsequent pattern transfer to the underlying layers. The radiation source, imaging optics, mask type and resist performance determine the minimum feature size that can be reproduced by the lithography process. Imaging of mask patterns with critical dimensions smaller than the exposure wavelength results in distorted images of the original layout pattern, primarily because of optical proximity effects of the imaging optics. Nonlinear response of the photoresist to variability in exposure tool and mask manufacturing process as well as variability in resist and thin film processes also contribute to image distortion. These distortions include variations in the line-widths of identically drawn features in dense and isolated environments (iso-dense bias), line-end pullback or line-end shortening from drawn positions and corner rounding. The process of correcting these types of distortions is called optical proximity correction or optical and process correction (OPC). OPC is a procedure of pre-distorting the mask layout by using simple shape manipulation rules (rule-based OPC) or fragmenting the original polygon into line segments and moving these segments to favorable positions as determined by a process model (model-based OPC). OPCed mask improves image fidelity on a wafer.

As the semiconductor industry pushes to resolve smaller critical dimensions, the need to provide more accurate OPC modeling becomes critical. Present techniques are either based solely on experiment and observation rather than theory, i.e., empirical, or are derived from first principals. Empirical models are generated using top down critical dimension measurements or scanning electron microscope (SEM) images.

Currently, existing OPC models do not take into account the slope of the resist while leading wafer level simulators (such as Prolith) approximate the image slope at best by correlating the slope of the resist profile, at several focus and exposure settings, to a cross-section and adjusting diffusion parameters to get the profiles-close. Because of this, first principal models are susceptible to the same inaccuracies seen in the empirical models. First principal models are inaccurate because they fail to fully grasp every aspect of lithography (diffusion, reflectivity, flare, etc.), so their functions are inaccurate. Empirical models generated from top down images or critical dimensions are inaccurate because they assume the slope from the image contrast.

Existing OPC models are disadvantageous because they are unable to accurately model the top critical dimension, the bottom critical dimension, resist loss, profile and the diffusion effects through focus, due to the limited information available in the empirical data based only on top down critical dimensions/images.

Therefore, an improved method for OPC modeling is needed. The present invention provides such a method for OPC modeling. Features and advantages of the present invention will become apparent upon a reading of the attached specification, in combination with a study of the drawings.

OBJECTS AND SUMMARY OF THE INVENTION

A primary object of the invention is to provide a method of OPC modeling using pattern recognition of cross-sections through focus, which will capture the top critical dimension, bottom critical dimension, resist loss, profile and the diffusion effects through focus.

Another object of the invention is to provide a method of OPC modeling which impacts the accuracy of OPC application and process window predictions.

Briefly, and in accordance with the foregoing, the present invention provides a method for OPC modeling. The procedure for tuning a model involves collecting cross-section images and critical dimension measurements through a matrix of focus and exposure settings. These images would then run through a pattern recognition system to capture top critical dimensions, bottom critical dimensions, resist loss, profile and the diffusion effects through focus and exposure.

BRIEF DESCRIPTION OF THE DRAWINGS

The features of the present invention which are believed to be novel, are described in detail herein below. The organization and manner of the structure and operation of the invention, together with further objects and advantages thereof, may best be understood by reference to the following description taken in connection with the accompanying drawings wherein like reference numerals identify like elements in which.

DETAILED DESCRIPTION OF THE ILLUSTRATED EMBODIMENT

Figure 1:
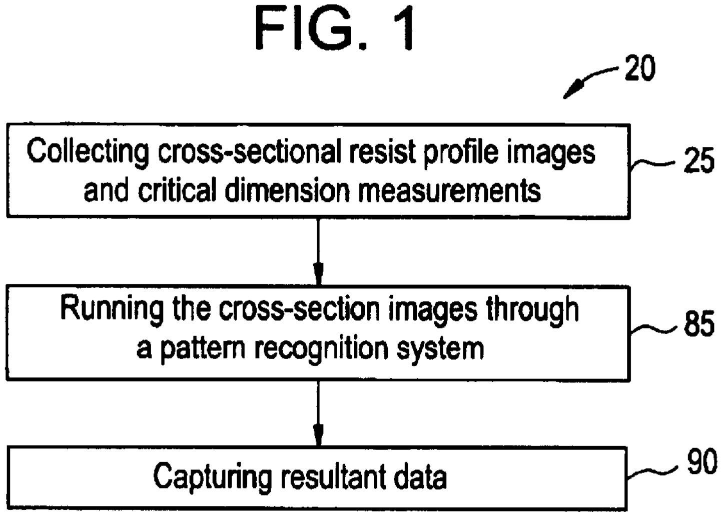
FIG. 1 is a flow chart illustrating a method of tuning a model in accordance with an embodiment of the present invention.

While this invention may be susceptible to embodiment in different forms, there is shown in the drawings and will be described herein in detail, a specific embodiment with the understanding that the present disclosure is to be considered an exemplification of the principles of the invention, and is not intended to limit the invention to that as illustrated and described herein.

A method (20) of tuning a model is illustrated in FIG. 1. The method (20) tunes a model using pattern recognition of cross-section images through focus to capture the top critical dimension, the bottom critical dimension, resist loss, profile and the diffusion effects through focus, whereas the prior art methods assume this information based only on top down critical dimensions/images collected from top down scanning electron microscopes. Cross-sectional data, whether collected from a focused ion beam and/or a cleaved wafer, provides more information (such as top and bottom critical dimension, resist loss, profile and the diffusion effects) than can be obtained with existing top down scanning electron microscope measurements/images and, thus, accuracy is improved by the measurement technique and the additional data from the cross-section.

The method (20) begins with the collection of cross-sectional resist profile images and critical dimension measurements (25). The cross-sectional resist profile images and critical dimension measurements are collected through a matrix of focus and exposure setting.

Figure 2:
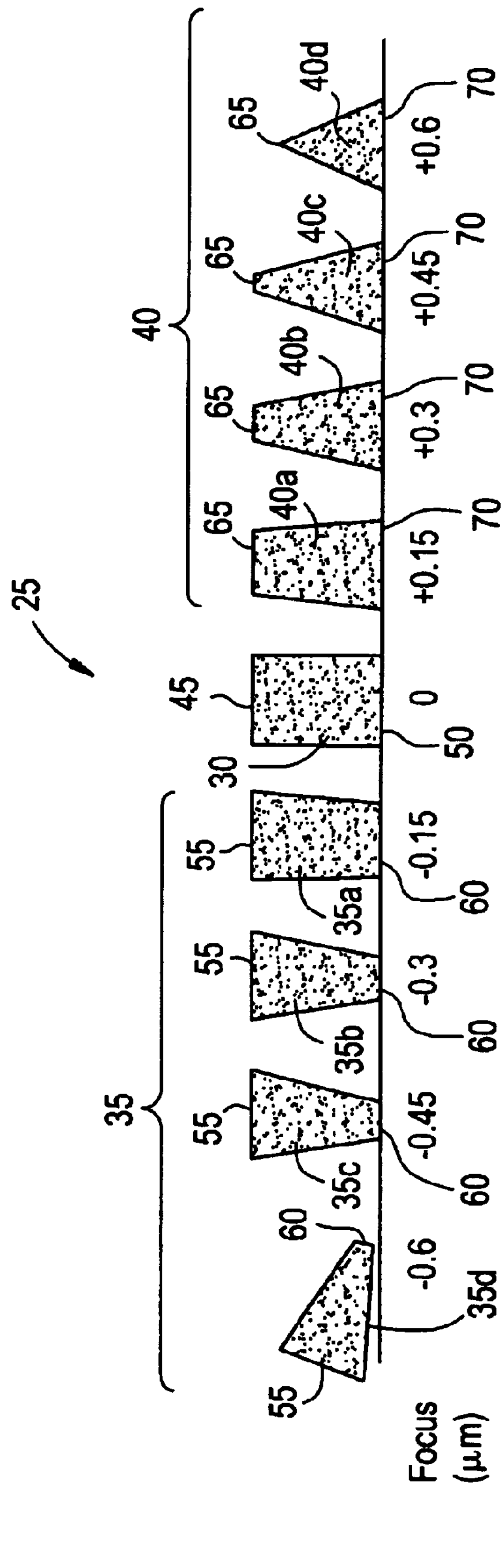
FIG. 2 is a chart illustrating the cross-sectional resist profiles through a matrix of focuses at which the collection of cross-sectional images and critical dimension measurements are taken in the method illustrated in FIG. 1.

As illustrated in FIG. 2, the collection of cross-sectional resist profile images and critical dimension measurements (25) include the best focus (30), which is taken at 0.00 micrometers. From the best focus (30), increasing negative focuses (35), such as −0.15 micrometers (35*a*), −0.30 micrometers (35*b*), −0.45 micrometers (35*c*), and −0.60 micrometers (35*d*), and increasing positive focuses (40), such as 0.15 micrometers (40*a*), 0.30 micrometers (40*b*), 0.45 micrometers (40*c*), and 0.60 micrometers (40*d*), are also collected. Of course, it is to be understood that these negative focuses (35*a*–35*d*) and positive focuses (40*a*–40*d*) are only representative negative and positive focuses, and that other negative and positive focuses (35, 40) can be collected if desired.

As illustrated in FIG. 2, the cross-sectional resist profile image and critical dimension measurement (25) taken at the best focus (30), a top dimension (45) is equal to the bottom dimension (50). As further illustrated in FIG. 2, the cross-sectional resist profile images and critical dimension measurements (25) taken through increased negative focuses (35), the top dimensions (55) stay equal to the top dimension (45), while the bottom dimensions (60) are decreased relative to the bottom dimension (50), such that the profiles taper from the top dimensions (55) to the bottom dimensions (60). Also, as illustrated in FIG. 2, the cross-sectional resist profile images and critical dimension measurements (25) taken through increased positive focuses (40), the top dimensions (65) are decreased relative to the top dimension (45), while the bottom dimensions (70) stay equal to the bottom dimension (50). Existing top down critical dimension measurements would not be able to see the undercut that is happening in the negative focus region, nor would it see the amount of resist loss in the positive focus direction. Due to the lack of this information in existing tuning methods, they are unable to model the process fully and accurately. At best, they will approximate it.

Figure 3:
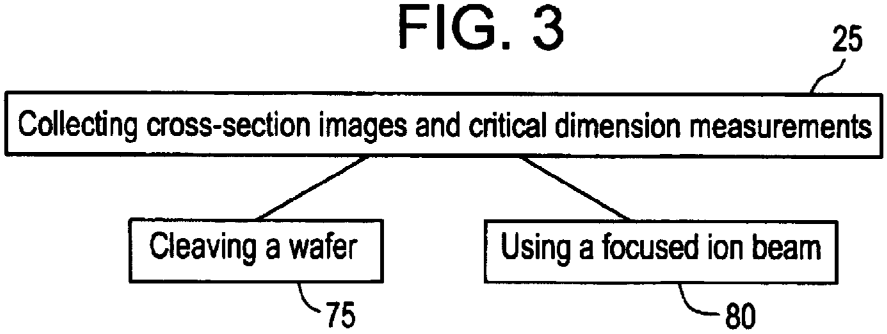
FIG. 3 is a chart illustrating the different manners in which the cross-section images and critical dimension measurements are collected in the method illustrated in FIG. 1.

In the preferred embodiment of the method (20), the cross-sectional resist profile images and critical dimension measurements are collected (25) in one of two ways, as illustrated in FIG. 3. In a first manner, the cross-sectional resist profile images and critical dimension measurements are collected (25) by cleaving a wafer (75). In a second manner, the cross-sectional resist profile images and critical dimension measurements are collected (25) through the use of a focused ion beam (80). Use of a focused ion beam (80) does not destroy the wafer and the focused ion beam could be used inline on a production wafer.

As illustrated in FIG. 1, once the cross-sectional resist profile images and critical dimension measurements are collected (25), the next step of the method (20) is to run the collected cross-section images through a pattern recognition system (85). By running the collected cross-section images through a pattern recognition system (85), the final step of the method (20), capturing resultant data (90), is achieved.

Figure 4:
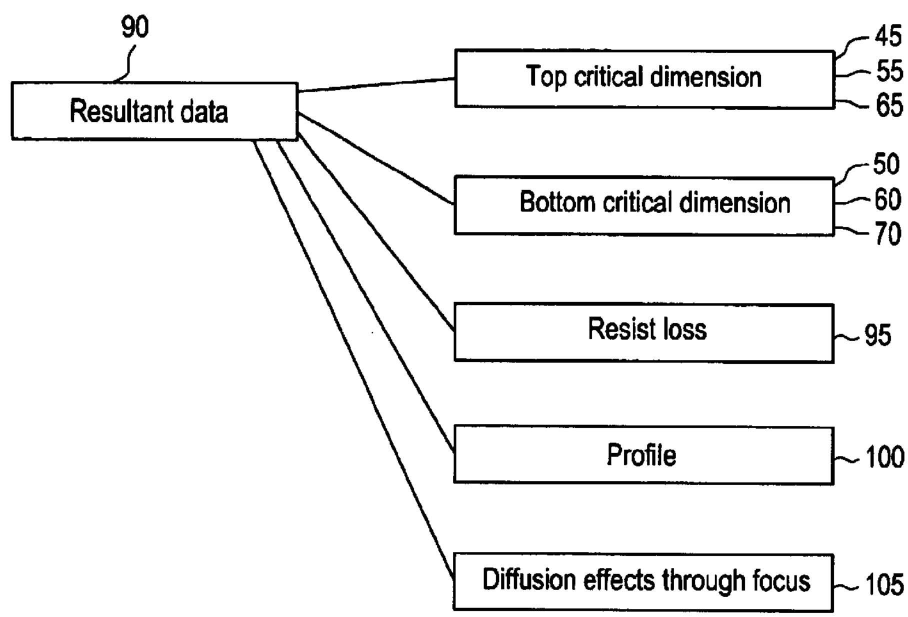
FIG. 4 is a chart illustrating the different types of resultant data which are captured in the method illustrated in FIG. 1.

The captured resultant data (90), as illustrated in FIG. 4, includes, but is not limited to, top critical dimensions (45, 55, 65), bottom critical dimension (50, 60, 70), resist loss (95), profile (100), and diffusion effects through focus (105).

The resultant data (90) provides much more information than existing top down measurements or images and results in a model that is better able to predict diffusion effects. For example, in the prior art, the features of the negative focuses (35*a*–35*d*) would not appear to be any worse than the features of the best focus (30) because the negative focuses (35*a*–35*d*) would have been looked at from the top down (as is currently done with a scanning electron microscope). By looking at the focuses (30, 35) from the top down, the top dimensions (55) of the negative focuses (35) would be equal to the top dimension (45) at the best focus (30), it would not be known that the bottom dimensions (66) of the negative focuses (35) would be less than the bottom dimension (50) at the best focus (30). That is, until an image falls over due to the undercut, as negative focus (35*d*) illustrates. However, as illustrated in FIG. 2, when viewing cross-sectional images (25), it is seen that the bottom dimensions (60) of the negative focuses (35) are not equal to the bottom dimension (50) at the best focus (30), even prior to an image falling over due to the undercut, as negative focus (35*d*) illustrates. Top down images would also not be able to capture resist loss that is seen as you go positive in focus using cross-sectional images (25). Improvements in the process model directly impact the accuracy of OPC application and process window predictions.

If desired, the method (20) could be used in conjunction with existing measurements/images, such as top down critical dimension/image data.

Figure 5:
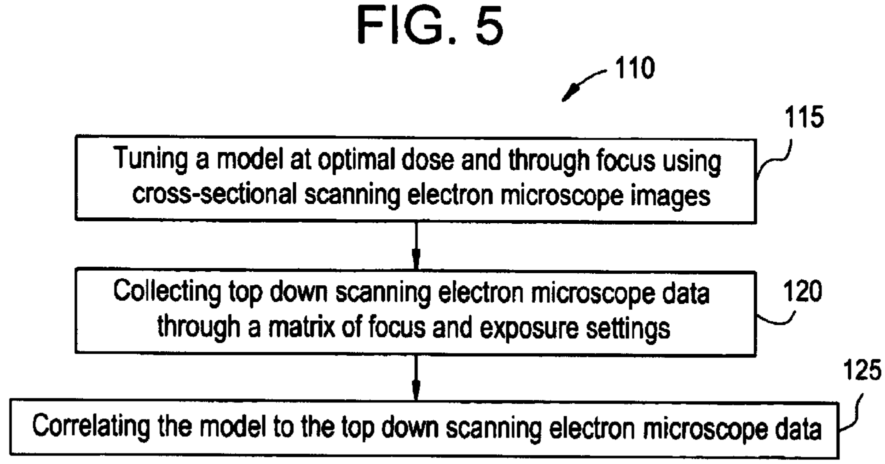
FIG. 5 is a flow chart illustrating a method of OPC modeling in accordance with an embodiment of the invention.

An alternative method of OPC modeling (110) is illustrated in FIG. 5. The method (110) includes the steps of:

a) tuning a model at optimal dose and through focus using cross-sectional scanning electron microscope images (115);

b) collecting top down scanning electron microscope data through a matrix of focus and exposure settings (120); and c) correlating the model to the top down scanning electron microscope data collected through a matrix of focus and exposure settings (125).

The method (110) provides the additional data for a high accuracy model without having to take additional cross-section images. The method (110) could also be combined with existing first principal techniques to improve accuracy.

While a preferred embodiment of the present invention is shown and described, it is envisioned that those skilled in the art may devise various modifications of the present invention without departing from the spirit and scope of the appended claims.

The invention is claimed as follows:

1. A method of tuning a model comprising the steps of:

a) collecting cross-section images of a resist profile, wherein each image includes a top surface, a bottom surface and sides of the resist profile;

b) running said cross-section images through a pattern recognition system; and c) capturing resultant data.

2. A method as defined in claim 1, wherein said cross-section images, top critical dimension measurements and bottom critical dimension measurements are collected through a matrix of focus and exposure setting.

3. A method as defined in claim 2, wherein said matrix of focus comprises negative focuses.

4. A method as defined in claim 3, wherein said negative focuses include −0.60 micrometers, −0.45 micrometers, −0.30 micrometers and −0.15 micrometers.

5. A method as defined in claim 2, wherein said matrix of focus comprises positive focuses.

6. A method as defined in claim 5, wherein said positive focuses comprise 0.15 micrometers, 0.30 micrometers, 0.45 micrometers, and 0.60 micrometers.

7. A method as defined in claim 2, wherein said matrix of focus comprises a best focus.

8. A method as defined in claim 7, wherein said best focus is 0.00 micrometers.

9. A method as defined in claim 1, wherein said resultant data comprises top critical dimensions.

10. A method as defined in claim 1, wherein said resultant data comprises bottom critical dimensions.

11. A method as defined in claim 1, wherein said resultant data comprises resist loss.

12. A method as defined in claim 1, wherein said resultant data comprises profile.

13. A method as defined in claim 1, wherein said resultant data comprises diffusion effects through focus.

14. A method as defined in claim 1, wherein said cross-section images are collected by cleaving a wafer.

15. A method as defined in claim 1, wherein said cross-section images are collected through a use of a focused ion beam.

* * * * *